United States Patent
Mukai et al.

(12) 
(10) Patent No.: US 6,747,339 B1
(45) Date of Patent: Jun. 8, 2004

(54) INTEGRATED CIRCUIT HAVING REDUCED SOFT ERRORS AND REDUCED PENETRATION OF ALKALI IMPURITIES INTO THE SUBSTRATE

(75) Inventors: Kiichiro Mukai, Hachioji (JP); Atsushi Saiki, Musashimurayama (JP); Seiki Harada, Hachioji (JP)

(73) Assignee: Hitachi, Ltd. (JP)

( * ) Notice: Subject to any disclaimer, the term of this patent is extended or adjusted under 35 U.S.C. 154(b) by 0 days.

(21) Appl. No.: 08/362,293

(22) Filed: Dec. 22, 1994

Related U.S. Application Data

(63) Continuation of application No. 08/165,538, filed on Dec. 13, 1993, now Pat. No. 5,391,915, which is a continuation of application No. 07/759,003, filed on Sep. 9, 1991, now abandoned, which is a continuation of application No. 07/462,882, filed on Jan. 3, 1990, now abandoned, which is a continuation of application No. 07/169,946, filed on Mar. 18, 1988, now abandoned, which is a division of application No. 06/908,782, filed on Sep. 18, 1986, now abandoned, which is a continuation-in-part of application No. 06/750,783, filed on Jul. 1, 1985, now abandoned, which is a continuation of application No. 06/351,665, filed on Feb. 24, 1982, now abandoned, and a continuation of application No. 06/092,502, filed on Nov. 8, 1979, now abandoned.

(30) Foreign Application Priority Data

Nov. 20, 1978 (JP) ............................................. 53/142375

(51) Int. Cl.[7] .......................... H01L 23/58; H01L 23/06; H01L 23/04; H01L 29/40

(52) U.S. Cl. ...................... 257/643; 257/640; 257/684; 257/698; 257/773; 257/774

(58) Field of Search ................................. 257/640, 643, 257/684, 698, 773, 774

(56) References Cited

U.S. PATENT DOCUMENTS

| | | | |
|---|---|---|---|
| 3,597,269 A | | 8/1971 | Chang et al. |
| 3,767,492 A | * | 10/1973 | MacRae et al ................. 357/54 |
| 3,771,218 A | * | 11/1973 | Langdon ....................... 357/54 |
| 3,853,496 A | * | 12/1974 | Kim ............................. 357/54 |
| 3,985,597 A | * | 10/1976 | Zielinski ....................... 357/54 |
| 4,001,870 A | * | 1/1977 | Saiki et al. .................... 357/72 |
| 4,001,871 A | | 1/1977 | Tsunemitsu |
| 4,017,886 A | * | 4/1977 | Tomono et al. ............... 357/54 |
| 4,039,371 A | * | 8/1977 | Brunner et al. ............... 357/54 |
| 4,926,238 A | | 5/1990 | Mukai |

* cited by examiner

*Primary Examiner*—Ngân V. Ngô
(74) *Attorney, Agent, or Firm*—Dickstein Shapiro Morin & Oshinsky LLP

(57) ABSTRACT

A semiconductor device wherein a coating film which is made of a polyimide resin or a polyimide isoindoloquinazolinedione resin and which is at least 10 μm thick is disposed on at least an active region of a semiconductor substrate, and the resultant semiconductor substrate is encapsulated in a ceramic package. The semiconductor device has troubles relieved conspicuously, the troubles being ascribable to alpha-rays which come flying from impurities contained in the material of the package.

63 Claims, 4 Drawing Sheets

INTEGRATED CIRCUIT HAVING REDUCED SOFT ERRORS AND REDUCED PENETRATION OF ALKALI IMPURITIES INTO THE SUBSTRATE

CROSS-REFERENCE TO RELATED APPLICATIONS

This application is a continuation application of application Ser. No. 08/165,538, filed Dec. 13, 1993, now U.S. Pat. No. 5,391,915, which is a continuation of application Ser. No. 07/759,003, filed Sep. 9, 1991, now abandoned, which is a continuation of application Ser. No. 07/462,882, filed Jan. 3, 1990, now abandoned, which is a continuation of application Ser. No. 07/169,946, filed Mar. 18, 1988, now abandoned, which is a division of application Ser. No. 06/908,782, filed Sep. 18, 1986, now abandoned, which is a continuation-in-part of application Ser. No. 06/750,783, filed Jul. 1, 1985, now abandoned, which is a continuation of application Ser. No. 06/351,665, filed Feb. 24, 1982, now abandoned, which is a continuation of application Ser. No. 06/092,502, filed Nov. 8, 1979, now abandoned.

BACKGROUND OF THE INVENTION i) Field of the Invention

This invention relates to a semiconductor device of very excellent reliability and a method for producing the same, and more particularly to a semiconductor device free of any trouble due to alpha-rays from a package and a method for producing the same.

ii) Brief Description of the Prior Art

In general, semiconductor devices are sealed usually by the ceramic package (including also a method—cerdip—in which the ceramic package is sealed with glass), the plastic package, or the like. Especially in the ceramic package among these packages, ceramic materials contain uranium, thorium etc. on the order of several ppm. As stated in, for example, the "16th Proceedings of Reliability Physics (1978)", at page 33, it has been known that these impurities emit alpha-rays and therefore cause failures (called "soft errors") in memory devices etc. For this reason, the reliability of the semiconductor devices may lower conspicuously.

On the other hand, when powder, such as alumina, called filler is used in plastic package materials, the impurities are also contained in the filler. The filler is less influential on the integrated circuit devices than in the case of the ceramic encapsulation because it is surrounded with plastic materials such as epoxy resin and the alpha-rays emitted from the impurities are absorbed by the plastics. These plastic materials, however, have the disadvantages of comparatively low reliability in moisture resistance and heat resistance on account of the fact that the moisture absorbability is high, the fact that the contents of alkali impurities typified by Na are high and the fact that the heat resistance is as low as at most about 150° C. It is therefore difficult to employ plastic-encapsulated integrated circuit devices in systems of high reliability. Accordingly, integrated circuit devices for use in the high-reliability systems need to be subjected to the ceramic type encapsulation.

For these reasons it has been strongly desired to prevent soft error of the semiconductor memory device caused by alpha-particles coming from uranium and thorium contained in the ceramic package as impurities.

In *Electronics*, Jun. 8, 1978, pages 42–43, it is shown that this problem is attacking from several different directions, for instance, by devising new packaging material process or applying protective coating to the upper surface of the chip.

However, this article does not disclose the most favorable materials or necessary characteristics of the protective coating in order to prevent soft error caused by alpha particles.

*IEEE Journal of Solid State Circuits*, vol. SC-13, No. 4, August, 1978, pages 462–467 shows planar multilevel interconnection technology employing a polyimide resin.

However, in this article, the polyimide films having a thickness of 2.5 $\mu$m are employed for interlevel dielectrics and final passivation. It must be recognized, however, that such thin films of polyimide cannot prevent penetration of alpha particles coming from outside of the film such as the ceramic package.

The use of the polyimide film as the protective film or coating to prevent soft error of the semiconductor memory device caused by alpha particles is not disclosed in this article.

Also, some prior art references show the use of polyimide resin in the field of the semiconductor devices, however, none of these references show the use of polyimide as a protective film or coating to prevent soft error of a semiconductor memory device caused by alpha particles.

For instance, U.S. Pat. No. 4,017,886 provides a polyimide layer between an $SiO_2$ layer and a metal layer to bond a wire with the electrode very easily by forming a flat upper surface on which the metal layer is formed.

Furthermore, Japanese Patent publications No. 47-12609 and No. 52-26989 show the uses of polyimide for insulation and final passivation, respectively.

There is no disclosure in those prior art references concerning prevention of soft error caused by alpha particles.

SUMMARY OF THE INVENTION

This invention has for its object to eliminate the disadvantages of the prior art, and to provide a semiconductor device which maintains a high reliability for moisture and heat exhibited by the ceramic encapsulation wherein the failure of an integrated circuit due to alpha-rays as previously stated, is prevented from occurring; as well as a method for producing such a semiconductor device.

In order to accomplish the object, a semiconductor device according to this invention has a coating film on at least a region of an element in a semiconductor substrate having at least one element, the coating film being made of a polyimide resin or a polyimide isoindoloquinazolinedione resin (hereinbelow, written "PII resin") and being 10 $\mu$m or more thick, and it is encapsulated in a ceramic package.

The semiconductor device of this invention causes the polyimide resin or the PII resin to attenuate and absorb alpha particles which emit from impurities contained in a package material. Accordingly, the resin coating film to serve as an attenuating material and an absorbing material is required to be a film thick to the extent of preventing the alpha particles from penetrating therethrough. In order to avoid any fluctuation in the characteristics of the element, the thickness should preferably be at least 10 $\mu$m and more preferably be at least 30 $\mu$m. The capability of preventing the penetration of the alpha particles is not limited to the resin coating films, but it is generally possessed by insulating films. It is extremely difficult, however, that insulating films of silicon dioxide, phophosilicate glass, silicon nitride, aluminum oxide etc. having heretofore been employed in semiconductor devices are deposited on semiconductor substrates 10 $\mu$m or more. More specifically, these insulating films formed by the chemical vapor deposition undergo very high stresses and cause cracks when deposited several $\mu$m or more. With the sputtering process, the insulating films can be deposited under the condition under which the proportion of development of the cracks is held comparatively low. However, the deposition rate is as very low as several hundreds Å/min, and it is actually impossible to deposit the films 10 μm or more. In contrast, with the polyimide resin or the PII resin, the stress of the film is as very low as about 4 Kg f/mm$^2$. In addition, the breaking distortion is about 30%, which is approximately one order greater as compared with those of the aforecited inorganic insulating films. Therefore, a thick film of several tens μm can be formed under the condition under which quite no crack develops. On the other hand, among high polymer resins, some possess film forming characteristics similar to those of the polyimide resin and the PII resin. Since, however, the sealing step of the ceramic package is ordinarily executed at high temperatures of around 450° C., a heat-resisting property enough to endure the temperatures is required, and no resin other than the aforecited ones satisfies this property.

More specifically, as exemplified in FIG. 1, when various high polymer resins are subjected to thermogravimetric analyses, decreases in weight begin at 200°–250° C. in case of a silicone resin 13 and in case of an epoxy resin 14, whereas a decrease starts at 500° C. in case of the polyimide resin 12. In case of the PII resin 11, the heat resistance is more excellent, and the weight residue at 600° C. is approximately 70% which is the most excellent. In this manner, the polyimide resin or the PII resin has the heat-resisting property against the high temperature step described previously.

In the PII resin or the polyimide resin, the contents of impurities such as uranium and thorium functioning as alpha-ray generating sources are as very low as 0.1—several ppb or so (the impurity analyses resorted to radioactivation analyses). Accordingly, the PII resin or the polyimide resin stops the alpha-rays emitted from the ceramic package material, and simultaneously, the alpha-rays to be generated by the resin itself become an extremely small amount. On the other hand, it can be generally said that organic high polymer materials are lower in the impurity contents than inorganic materials. However, in case of a polyethylene resin taken as an example of the organic high polymer material, the uranium content is 40–50 ppb which is comparatively high, and the organic high polymer materials are not always suitable.

The coating of the polyimide resin or the PII resin attenuates and absorbs alpha particles coming from uranium and thorium contained in the ceramic package, thereby, penetration of alpha particles and soft error of the semiconductor memory device are effectively prevented. Furthermore, it is necessary that the amounts of alpha particles emitted from the coating film itself is extremely low.

The protective coating film to prevent soft error caused by alpha particles must satisfy following conditions.

(1) The amounts of uranium and thorium contained in the coating film itself is extremely low, i.e. less than 40 ppb, so that the coating film does not emit alpha rays enough to cause soft error of the semiconductor memory device.

(2) The coating film must have a thickness enough to attenuate and absorb alpha rays and must never have cracks.

(3) The coating film should be heat resistant so as to withstand heating in the packaging step (the assembly process includes a step of heating at 300° to 500° C.).

However, a material which can satisfy these conditions was not known before the present inventors.

The present inventors have found out that only the PII resin and the polyimide resin can satisfy these conditions from experiments requiring a great deal of expense and labor.

That is, it has been widely believed that organic resin materials surely contain remarkable amounts of impurities, such as uranium and thorium, because representative refining means, such as recrystallization or zone-refining are never employed to make the organic resin material.

However, the present inventors have carried out studies of the polyimide resin and the PII resin and have made clear by huge amounts of data that among many kinds of organic resin material, only the PII resin and the polyimide resin can satisfy above conditions but other resin materials can not satisfy them.

It is needless to say that in order to know which organic resin material can satisfy above condition (1), it is necessary to know the amounts of uranium and thorium contained in each resin, respectively.

However, trace analysis of uranium and thorium called for a great deal of expense and labor. The most reliable method of trace analysis of uranium and thorium is the radioactivation analysis by thermal neutrons in the nuclear reactor and no other methods are available that provided reliable data.

This method involves placing the sample of the organic resin material in the nuclear reactor, radiating thermal neutrons to activate the sample and measuring the uranium and thorium contents from the attenuation curve of the gamma-rays generated upon disintegration of the radioactivated element.

This method requires the use of the nuclear reactor for one full day and attenuation of the gamma-rays must be continuously measured for about two days for the test of one sample. Therefore, to obtain the data of five samples of Table 1 4,000,000 yen and a great deal of effort was necessary.

The amounts of uranium and thorium contained in five kinds of organic resin materials measured by the present inventors are shown in Table 1.

TABLE 1

| MATERIAL | CONTENT (ppb) | |
|---|---|---|
|  | URANIUM | THORIUM |
| Polyimide Resin | 0.1~10 | 0.1~10 |
| PII Resin | 0.1~10 | 0.1~10 |
| Epoxy Resin | ~1,000 | ~1,000 |
| Silicon Resin | ~1,000 | 100~1,000 |
| Polyethylene Resin | 40~50 | ~50 |

From Table 1, it is evident that among five kinds of organic resin material, only the PII resin and polyimide resin can satisfy above condition (1). However, the other resin materials contain more than 40 ppb of uranium and thorium and cannot satisfy condition (1).

Also, it should be recognized that the protective film to prevent the soft error of the semiconductor memory device must have a thickness sufficient to prevent the penetration of alpha particles therethrough coming from the ceramic package.

The capability of preventing the penetration of alpha particles is not limited to the resin coating film. However, the present inventors found out from their experiments, that it is extremely difficult to form an inorganic material film having such a thickness, 10 μm or more.

That is, according to the present inventors' experiments, it was extremely difficult to form protective films having a thickness of 10 μm or more, of silicon dioxide, phosphosilicate glass, silicon nitride, aluminum oxide, etc., on a semiconductor substrate. More specifically, these inorganic insulating films formed by the chemical vapor deposition undergo very high stresses and cause cracks when deposited at thicknesses of several μm or more. With the sputtering process, the insulating films can be deposited so that development of the cracks is suppressed and the crack development is comparatively low. However, the deposition rate in this process is very low, i.e. on the order of several hundreds Å/min., and it is actually impossible to form a film having a thickness of 10 μm or more.

Accordingly, it is not possible to satisfy condition (2) using an inorganic insulating material.

In contrast with the polyimide resin or the PII resin of this invention, the stress of the film is very low as about 4 kgf/mm$^2$. In addition, the breaking distortion is about 30%, which is one order greater as compared with those of aforesaid inorganic insulating films. Therefore, a thick film of more than 10 μm can be easily formed under the condition under which no crack develops.

On the other hand, among high molecular organic resins, some possess film forming characteristics similar to those of the PII resin and the polyimide resin. Since, however, the sealing step of the ceramic package is ordinarily executed at high temperatures of 300°–500° C., a heat-resisting property enough to endure the temperatures is required, and no resin other than the PII resin and the polyimide resin satisfies this property.

More specifically, as exemplified in FIG. 1, when various organic resin materials are subjected to thermogravimetric analysis, decreases in weight begin at 200°–250° C. in the case of a silicon resin 13 and in the case of an epoxy resin 14; whereas, a decrease starts at 500° C. in the case of the polyimide resin 12. In case of the PII resin 11, the heat resistance is more excellent, and the weight residue at 600° C. is approximately 70% which is the most excellent.

Therefore, it is recognized that among those resin materials, only the PII resin and the polyimide resin can satisfy the aforementioned conditions (2) and (3), the other organic resin materials cannot satisfy the condition (3).

As heretofore described in the PII resin and the polyimide resin, the contents of uranium and thorium are extremely low. Accordingly, the PII resin and the polyimide resin stops the alpha-rays emitted from the ceramic package, and simultaneously, the alpha-rays to be generated by the alpha generators in the resin itself are in an extremely small amount. Therefore, these resins are very superior for the protective film to prevent soft error caused by the alpha rays. In order to avoid any fluctuation in the characteristics of the semiconductor memory device, the thickness of the PII resin film or the polyimide resin film should preferably be at least 10 μm, more preferably at least 30 μm. Both the PII resin and the polyimide resin can be said to be excellent materials also from the standpoint of the impurity contents of uranium, thorium, etc. As previously stated, however, the PII resin is more favorable due to its heat resistance.

Here, the "polyimide resin" shall mean a polymeric material which is obtained by the reaction between aromatic diamine and aromatic tetracarboxylic acid dianhydride, while the "PII resin" shall mean a polymeric material which is obtained by the reaction among aromatic diamine, aromatic tetracarboxylic acid dianhydride and aromatic diaminocarboxamide. Both are well known, and the PII resin is described in detail along with a manufacturing method therefor in, for example, the official gazette of Japanese patent application publication No. 48-2956.

Since it is the semiconductor element that is influenced by the alpha-rays, a semiconductor substrate to be used in this invention includes at least one element or at least one active region which is affected by the entrance of the alpha-rays. Since that part of the semiconductor substrate which is affected by the alpha-rays is a portion of the element region, the coating film of the resin to be disposed for stopping the invasion of the alpha-rays must exist at least on the region of the element or the active region.

In the presence of an insulating layer, an electrode, an interconnection layer etc., the semiconductor substrate shall include them. The semiconductor devices of this invention are mainly constructed of monolithic integrated circuits.

The ceramic encapsulation is a technique well known in the field of semiconductor technology, and all the ceramic packagings having hitherto been employed can be applied. The ceramic packagings are, for example, those called "cofired ceramic dip" and "cerdip". The ceramics usually contain aluminous ceramics as their principal constituents, but any of the ceramic materials having hitherto been employed may be used. Further, glass whose principal constituent is lead glass is employed for the bonding between the ceramics in the cerdip type. In the cofired ceramic dip type, on a ceramic package to which the semiconductor substrate is die-bonded, a cover made of a metal such as Kovar or a ceramic is bonded by the seam welding or with a binder such as eutectic alloy between Au and Sn.

The polyimide resin and the PII resin (especially the polyimide resin) sometimes contain some (on the order of several ppm) alkali impurities such as Na. In this case, when the semiconductor substrate is formed thereon with the resin film of, for example, the polyimide resin and is subjected to a heat treatment at a high temperature, the alkali impurities permeate into the interior of the semiconductor substrate through pinholes etc. existent in an insulating film disposed on the surface of a semiconductor sheet constituting the semiconductor substrate, and they can change the characteristics of the element. To the end of preventing this drawback, it is effective that a phosphosilicate glass film or a silicon nitride film which has a high capability of checking the permeation of the alkali ions is formed on the semiconductor substrate and interposed between it and the polyimide resin.

The foregoing semiconductor device of this invention can be readily manufactured by a producing method including: (i) the step of covering at least a region of an element in a semiconductor substrate having at least one element, with a polyimide resin or a PII resin having a thickness of 10 μm or more, and (ii) the step of encapsulating in a ceramic package the semiconductor substrate covered with the resin.

BRIEF DESCRIPTION OF THE DRAWINGS

FIG. 2a is a sectional view of a semiconductor substrate formed with a high polymer resin film in an embodiment of this invention, while FIG. 5a is a sectional view of a semiconductor device in an embodiment of this invention, while FIG. 9a is a plan view of a polyimide resin film tape for use in an embodiment in which the film carrier method is applied to this invention, while

DESCRIPTION OF THE PRESENTLY PREFERRED EMBODIMENTS

Hereafter, the effects of this invention will be described more in detail in connection with examples.

EXAMPLE 1

This will be described with reference to FIG. 2a. A PII resin film 23 which is 4–37 $\mu$m thick was formed on a 4-kbit NMOS dynamic RAM (Random Access Memory) $V_{DD}$=12 V) 21 whose body was made of a silicon semiconductor.

Figure 1:
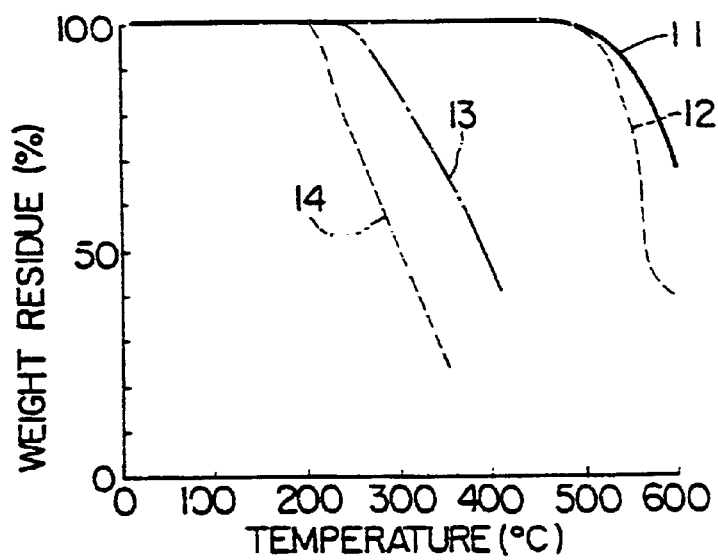
FIG. 1 is a graph showing the thermogravimetric curves of various high polymer resins.
Figure 3:
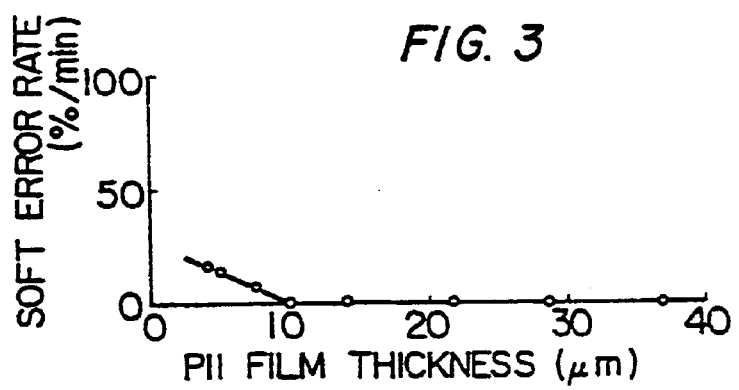
FIGS. 3 and 4 are graphs showing the relationships between the thickness of a PII resin film and the soft error rate due to alpha-rays in semiconductor devices in embodiments of this invention.

The PII resin was applied onto the wafer by the spin-on method, it was semicured by subjecting it to a heat treatment at 200° C. for 1 hour, and it was provided with the opening of a bonding pad portion 22 by photoetching with hydrazine hydrate. Thereafter, it was cured by subjecting it to heat treatments at 350° C. for 1 hour and at 450° C. for 10 minutes. Preferably the heat treatments are carried out in nitrogen or an inert gas. As the PII resin, PIQ (registered trademark of Hitachi Kasei Kabushiki-Kaisha in Japan) was employed. Also in various examples to be stated below, PIQ was employed as the PII resin. The resultant substrate was irradiated with alpha-rays of 5 MeV, and the soft error rate per minute was investigated. The result is indicated in FIG. 3. When the thickness of the PII resin film was 10 $\mu$m or more, no soft error occurred, and it was apparent that the PII resin film has the capability of stopping the alpha-rays. Further, the element was encapsulated in a ceramic package (cerdip type) as shown in FIG. 2b, and the soft error rate was investigated. As a result, the soft error rate was about 0.08%/1,000 hours when the PII resin film was not formed, whereas it was below 0.003%/1,000 hours when the pII resin film having a thickness of at least 10 $\mu$m was formed. A similar effect was verified with Pyre-ML (trade name of Dupont Inc. in U.S.A.) being the polyimide resin.

Figure 2A:
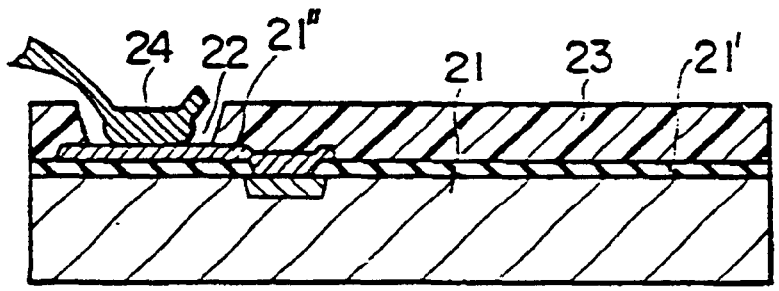
Figure 2B:
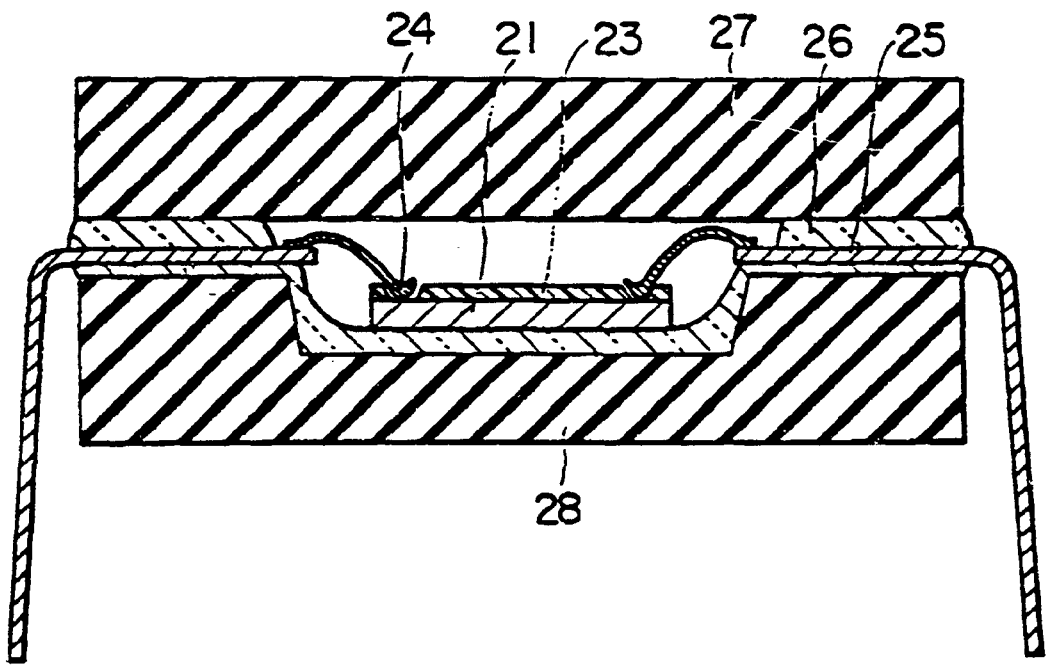
FIG. 2b is a sectional view of a semiconductor device in which the semiconductor substrate shown in FIG. 2a is encapsulated in a ceramic package.

In FIG. 2a, 21' designates an insulating film, 21" an interconnection conductor layer, and 24 a bonding wire to be connected with an external connection lead. In FIG. 2b, 25 designates the external connection lead, and 26 fused glass to hermetically bond ceramic 27 and ceramic 28.

EXAMPLE 2

Figure 4:
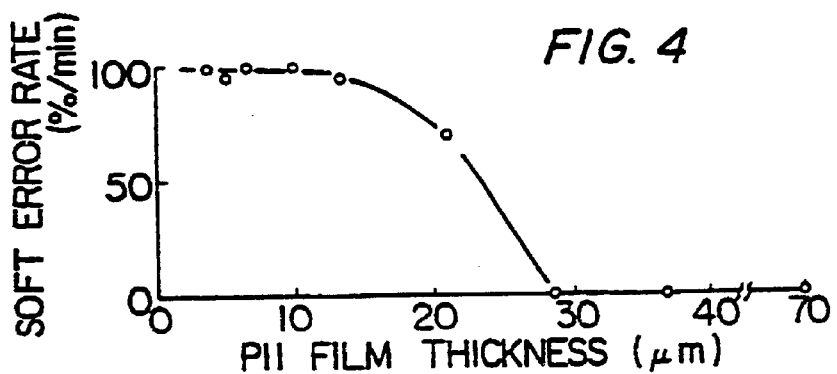

An experiment similar to that stated in Example 1 was conducted by using a 16-kbit NMOS dynamic RAM ($V_{DD}$=5 V). The result is indicated in FIG. 4. As apparent from FIG. 4, the polyimide resin or the PII resin whose film thickness is at least 28 $\mu$m is required in the present element. It is accordingly understood that the required film thickness of the PII resin varies depending upon elements, and it is generally desirable to make the film thickness 30–40 $\mu$m or greater. Among the elements, one formed with the PII resin film 70 $\mu$m was encapsulated in a ceramic package (cerdip type) and had the soft error rate investigated in the same manner as in Example 1. As a result, the soft error rate was 0.4%/1,000 hours in case where no PII resin was formed, whereas it was as excellent as 0.002%/1,000 hours in the present element.

Figure 5A:
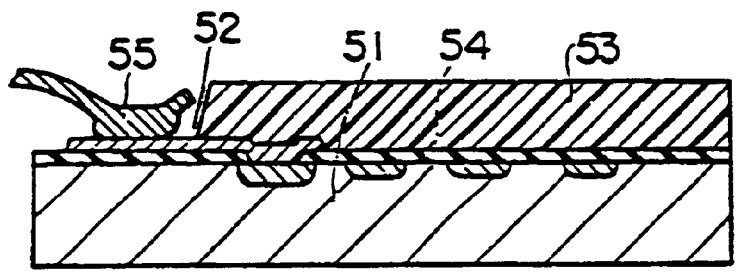
Figure 5B:
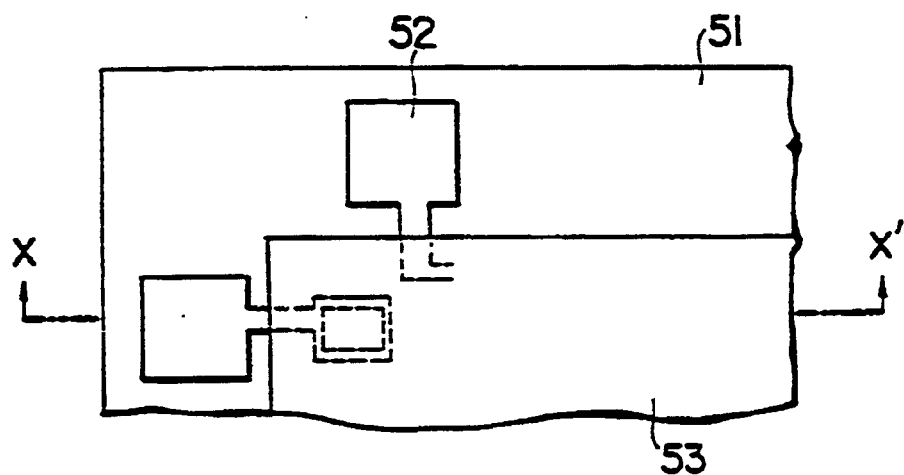
FIG. 5b is a plan view of the semiconductor device shown in FIG. 5a, FIG. 6 is a sectional view of a semiconductor device in which a resin film is formed on a semiconductor substrate by the potting in an embodiment of this invention.

It is obvious that the effects exhibited in this example and Example 1 are similar when a polyimide resin or PII resin film 53 is disposed on only an active region 54 as illustrated in FIGS. 5a and 5b, and it has been experimentally verified. In FIGS. 5a and 5b, numeral 51 designates a semiconductor substrate, numeral 52 a bonding pad portion, and numeral 55 a bonding wire. XX' in FIG. 5b designates the section illustrated by FIG. 5a.

EXAMPLE 3

Five kinds of organic polymer resin material shown in Table 1 were prepared to examine the effect to dynamic RAM soft error which was caused by alpha particles emitted from the ceramic package and coated protective film of the resin material itself.

These resin materials were coated on dynamic RAM chips employing well known spin-on technique and practical soft error rate was estimated, where 16 kb, 64 kb dynamic RAM's packaged in cerdip type ceramic package were used.

Thickness of coated protective film resin material was 70 $\mu$m for all kinds of resin. 1,000–5,000 semiconductor devices for each group were tested for 1,000–10,000 hours. Testing was performed by write-"0" for all semiconductor devices and read-"0" until error "1" appeared for several semiconductor devices among total semiconductor devices in each group.

The results were shown in Table 2.

Soft error rate for uncoated semiconductor devices was relatively higher than resin coated semiconductor devices. These results indicate that polymer resin coating mostly prevents transmission of alpha particles coming from the ceramic package.

TABLE 2

| COATING MATERIAL | Soft Error Rate (%/1,000 hr) | |
| --- | --- | --- |
| | 16 kb DRAM | 64 kb DRAM |
| Polyimide Resin | 0.002 | 0.004 |
| PII Resin | 0.002 | 0.006 |
| Epoxy Resin | 0.05 | 0.1 |
| Silicon Resin | 0.04 | 0.1 |
| Polyethylene Resin | 0.04 | 0.07 |
| Uncoated | 0.4 | 0.9 |

However, remarkable differences of soft error rate among resin coated dynamic RAM groups are observed. It is believed that these differences of soft error rate are caused by differences of uranium and thorium amounts contained in resin materials themselves, respectively.

It is recognized, therefore, that the semiconductor memory device having a protective coating film made of the PII resin or the polyimide resin is most favorable for preventing soft error caused by alpha particles.

EXAMPLE 4

Figure 6:
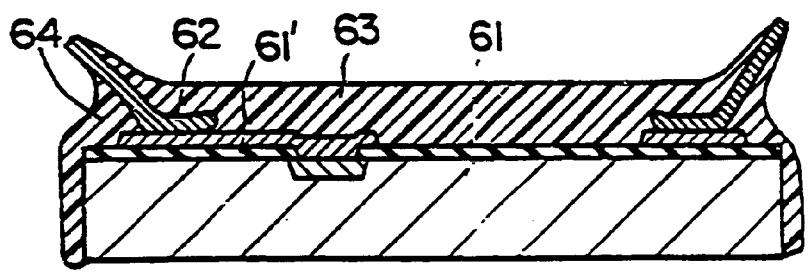

In this example, a 4-kbit NMOS dynamic RAM was used, a silicon semiconductor substrate 61 shown in FIG. 6 was die-bonded to the mount of a package, and a bonding wire 62 was bonded by the wire bonding for external connection. Thereafter, PII resin 63 was potted and subjected to heat treatments at 200° C. for 1 hour, at 350° C. for 1 hour and at 450° C. for 10 minutes. The thickness of the PII resin film was approximately 40–70 μm.

In case where the resin film is formed by the potting as in this example, it is desirable that the bonding wire 62 is made at least 30 μm in diameter. This serves to prevent the bonding wire 62 from coming into contact with a scribe grid 64 due to the shrinkage of the resin attendant upon curing. It is also desirable that an insulating film 61' is extended on the scribe grid 64 in advance. Any failure due to the irradiation with alpha-rays of 5 MeV did not occur in this example, either. The effect in the case where the present element was encapsulated in a ceramic package (cerdip type) was the same as in Example 1.

EXAMPLE 5

Figure 7:
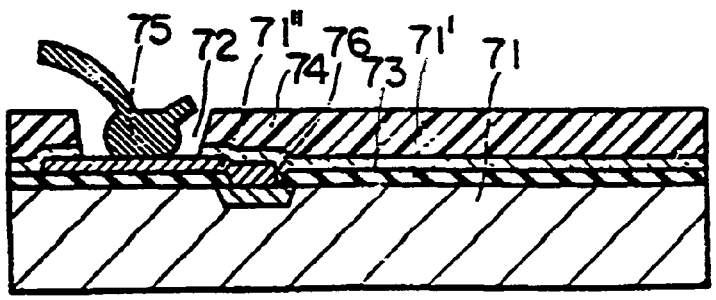
FIG. 7 is a sectional view of a semiconductor device in which, in an embodiment of this invention, a phosphosilicate glass or silicon nitride film is disposed on a semiconductor substrate and a resin film is formed thereon.

As stated before, the polyimide resin sometimes contains some (on the order of several ppm) alkali impurities such as Na. At this time, especially in the case where pinholes exist in an insulating film 71' or a part 76 appears due to the mask misalignment between an opening portion in the insulating film 71' and a metal interconnnection 71" as illustrated in FIG. 7, impurity ions can penetrate through the pinholes or the part to change the characteristics of an element when a polyimide resin film is formed on a semiconductor substrate and subjected to a heat treatment at a high temperature. It is therefore effective that a phosphosilicate glass or silicon nitride film which exhibits a high gathering ability to the alkali ions be formed on the semiconductor substrate and interposed between the substrate and the polyimide resin. That is, as shown in FIG. 7, phosphosilicate glass 73 is formed on a silicon semiconductor substrate 71 by the chemical vapor deposition, and a polyimide resin film 74 is formed thereon. The phosphosilicate glass should preferably have a phosphorus content of 3 mol % to 12 mol % and a film thickness of approximately 0.3 μm to a 1.5 μm. More specifically, the gathering ability of the phosphosilicate glass film to the alkali ions depends upon the phosphorus content, and an effect demonstrates itself at or above 3 mol %. On the other hand, as the phosphorus content becomes higher the moisture absorbability becomes higher, when the content exceeds 12 mol % defects such as corrosion of an Al interconnection begin to appear. The film thickness of the phosphosilicate glass needs to be at least 0.3 μm in order to cover the semiconductor substrate substantially fully. In addition, the thickness should desirably be at most 1.5 μm as a range in which any crack attributed to the tensile stress of the phosphosilicate glass itself does not take place. In this example, a 16-kbit NMOS dynamic RAM was used, and the phosphosilicate glass 73 at 4 mol % was formed 1.2 μm thick and was formed with the opening of a bonding pad portion 72 by the conventional photoetching. Thereafter, the polyimide resin film 74 was formed 40 μm thick. This polyimide resin film was formed by a method similar to that in Example 1. In a case where such phosphosilicate glass was not deposited and where the pinholes in the insulating film 71' and the mask-misalignment 76 as previously stated existed, the degradation of the available percentage on the order of 0.5–40% was noted when the polyimide resin film 74 was formed and subjected to a high-temperature heat treatment at or above 400° C. In contrast, in this example, the degradation of the available percentage due to the formation of the polyimide resin film was not incurred, and it was verified that any failure due to the irradiation with alpha-rays of 5 MeV did not occur. In the example, the soft error rate in the case of encapsulating the element in a ceramic package was as excellent as 0.002%/1,000 hours.

Even when the phosphosilicate glass 73 is replaced with a silicon nitride film, a similar effect is confirmed. The silicon nitride film can be formed by a known method such as sputtering and plasma (Plasma Enhanced Chemical Vapor Deposition), and it is desirable to resort to the plasma CVD. The thickness of the film should desirably lie in a range of from 0.2 to 3 μm. The film thickness of the silicon nitride needs to be at least 0.2 μm in order to cover the semiconductor substrate substantially completely. The upper limit should desirably set at approximately 3 μm as a range in which the plasma etching of the silicon nitride film to be stated below can be readily conducted. The silicon nitride film can be formed with an opening by, for example, the plasma etching employing $CF_4$. In FIG. 7, numeral 75 indicates a bonding wire.

It is to be understood that the same effect as above described is realized even when the PII resin is used instead of the polyimide resin or when the resin is formed by the potting.

EXAMPLE 6

Figure 8:
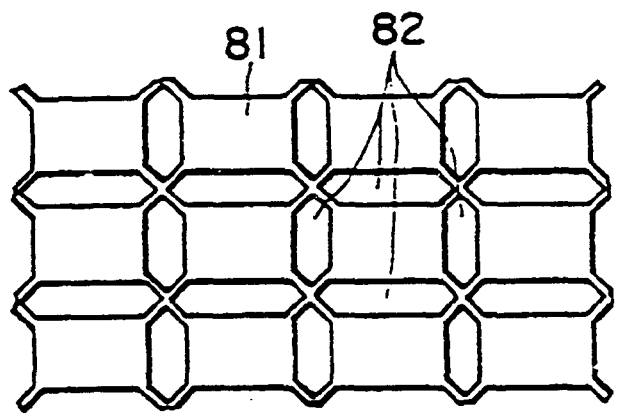
FIG. 8 is a plan view of a resin film to be compression-bonded onto a semiconductor substrate in an embodiment of this invention.

In this example, a polyimide resin or PII resin film 81 having openings 82, as shown in FIG. 8 was compression-bonded onto a silicon semiconductor wafer. The polyimide resin or PII resin film 81 was compression-bonded onto the wafer so that the openings 82 corresponded to bonding pad regions of a semiconductor substrate, so that active regions corresponding to the film 81 were disposed among the bonding pad regions, and so that a resin layer was arranged on the active regions. Further, the wafer was put into pellets by dicing, whereupon elements were assembled. The film was 50–500 μm thick. Here, a 4-kbit dynamic NMOS RAM was used. Any soft error due to their radiation with alpha-rays of 5 MeV did not occur in this example, either. Accordingly, the effect of this invention can be sufficiently expected even when the ceramic encapsulation is employed.

EXAMPLE 7

A region other than an active region of a silicon wafer formed with an element was covered with a mesh screen for printing. A prepolymer solution of PIQ (density: 19.5%, viscosity; about 10,000 cp) was applied by the roller coating from above the mesh screen. Thereafter, the coating was baked at 200° C. for 60 minutes and further baked at 350° C. for 60 minutes. Thus, a PIQ film being 50 μm thick was formed on only the active region. Here, a 4 kbit dynamic NMOS RAM was employed. Any soft error due to the irradiation with alpha-rays of 5 MeV did not occur in this example, either. Accordingly, the effect of lowering the soft error rate after the ceramic encapsulation can also be sufficiently expected.

EXAMPLE 8

A 4-kbit dynamic NMOS RAM was used, and this pellet was installed on the mount of the package. Thereafter, an uncured or semicured film of the polyimide resin or the PII resin was disposed so as to just cover an element forming region of the pellet. Thereafter, a the film was baked at 350° C. for 30 minutes. The uncured film was obtained as stated below. A prepolymer solution of polyimide (for example, Torayneece #3000, trade name of Kabushiki-Kaisha Toray in Japan) or a prepolymer of PIQ was applied onto a flat substrate (for example, glass plate), whereupon it was baked at 100° C. to substantially volatilize off its solvent. Then, an uncured film which was 30–50 μm thick was formed. Subsequently, the film was cut into a size corresponding to the dimensions of the pellet by means of a sharp cutter and was stripped off from the substrate, and the film obtained was put on the pellet of the IC. In the case where by baking was similarly conducted at 200° C., a semicured film which was also 30–50 μm thick was obtained. When the uncured and semicured films were put on the pellets and baked at 350° C. for 30 minutes, they were bonded well with the pellets and performed functions as protective films satisfactorily. The semiconductor device thus produced caused no soft error due to the irradiation with alpha-rays of 5 MeV. In case of the ceramic encapsulation, accordingly, the effect of this invention can be sufficiently expected.

As a modification of the present method, even when instead of the film piece of the polyimide resin or the PII resin, an Si piece in the same shape is bonded onto an active region with a prepolymer of the polyimide resin or the PII resin and then the prepolymer is thermally cured, the effect is not spoilt. In this case, the Si piece should desirably have its surface oxidized by the thermal oxidation in advance. Further, the bonding becomes good in such a way that, for example, a pyrolytic film of an aluminum chelate compound is formed on the surface of the thermal oxidation film as is well known, before the bonding with the prepolymer of the polyimide or PII resin.

EXAMPLE 9

Figure 9A:
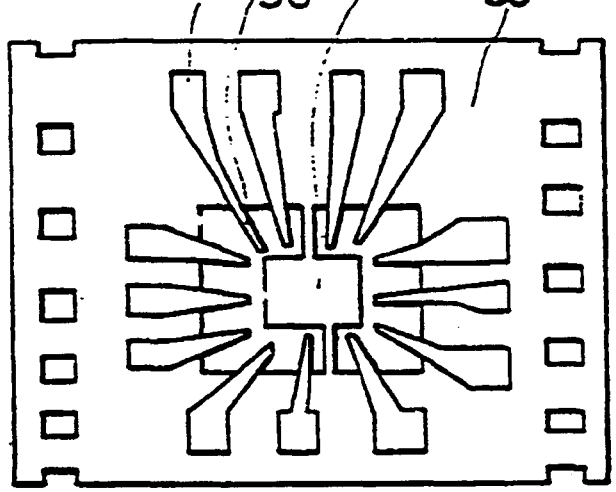
Figure 9B:
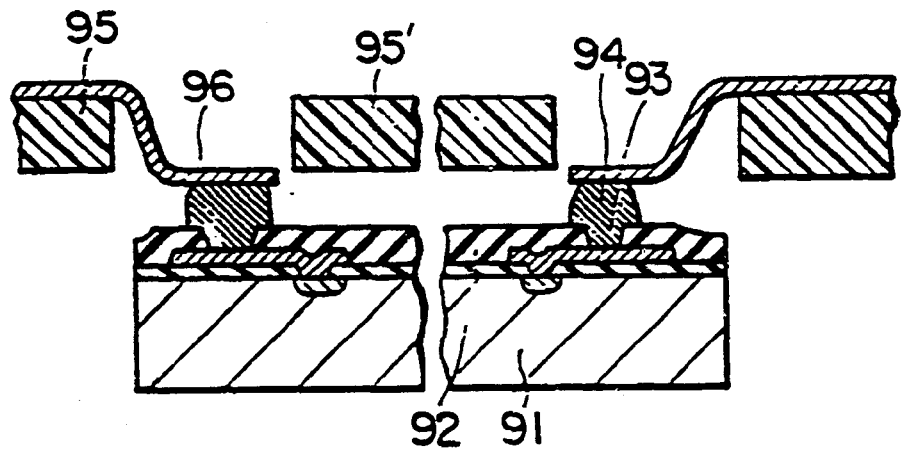
FIG. 9b is a sectional view of a semiconductor device after the film shown in FIG. 9a has been bonded.

This indicates an example in the case where a semiconductor device is assembled by the well-known film carrier method. First, description will be made with reference to FIG. 9b. Here, a 4-kbit dynamic NMOS RAM was used, and an insulating film 92 was formed on a semiconductor substrate 91. For the insulating film there are employed silicon compounds, for example, silicon oxide and silicon nitride, aluminum oxide etc. which are formed such methods as sputtering, plasma-enhanced CVD, and CVD. In this example, a silicon nitride film 1.5 μm thick can be formed by the plasma-enhanced CVD was employed. A viahole 93 was provided in the film by the plasma etching employing $CF_4$, and a bump 94 corresponding to a bonding pad portion was formed. In this example, a gold bump being about 30 μm thick was formed through an Ni—Cr alloy (500 Å) as well as Pd (2,000 Å) by plating. Subsequently, a tape as shown in FIG. 9a where in a polyimide film 95' located at an active region was formed on advance in a film carrier tape 95 having a thickness of 500 μm was attached to the semiconductor substrate by thermocompression bonding. The thermocompression bonding was made between copper foils 96 previously laminated on the polyimide film 95 and the bump 94 of gold. The irradiation with alpha-rays of 5 MeV was thereafter carried out, but the occurrence of any soft error was not noted. Accordingly, the effect of preventing the occurrence of any soft error after the ceramic encapsulation of the resultant semiconductor substrate can also be expected sufficiently. It is understood that the object of this invention is accomplished even when the polyimide film is not in close contact with the semiconductor substrate as thus far described. With this method, after cutting the polyimide film, the semiconductor substrate is connected with the package at parts 96' by the thermocompression bonding.

What is claimed is:

1. A monolithic integrated circuit device having reduced errors caused by the penetration of alpha particles into an active element thereof, said device comprising:

a semiconductor body;

at least one active element provided in an upper surface region of said body;

a first insulating film of inorganic insulating material formed on said upper surface of said semiconductor body;

an interconnection having a predetermined portion formed on said first insulating film and electrically connected with a predetermined portion of said active element;

a second insulating film of inorganic insulating material formed over said interconnection so as to expose the predetermined portion of said interconnection through a window, said second insulating film consisting essentially of silicon nitride or phosphosilicate glass;

a bonding wire electrically connected with said exposed predetermined portion of said interconnection; and a third insulating film of organic resin material formed on said second insulating film and over said active element, said third insulating film reduced the number of alpha particles which penetrate into said active element;

said organic resin material being a member selected from the group consisting of polyimide isoindoloquinazolinedione and polyimide and containing less than 40 ppb of uranium and thorium;

said second insulating film being constructed and arranged between said third insulating film and first insulating film to prevent the penetration of alkali impurities into said active element in said body which come from the third insulating film of organic resin material.

2. A monolithic integrated circuit device according to claim 1, wherein said second insulating film consists essentially of silicon nitride.

3. A monolithic integrated circuit device having reduced errors caused by the penetration of alpha particles into an active element thereof, said device comprising:

a semiconductor body;

at least one active element provided in an upper surface region of said body;

a first insulating film of inorganic insulating material formed on said upper surface of said semiconductor body;

an interconnection having a predetermined portion formed on said first insulating film and electrically connected with a predetermined portion of said active element;

a second insulating film of inorganic insulating material formed over said interconnection so as to expose the predetermined portion of said interconnection through a window, said second insulating film consisting essentially of silicon nitride or phosphosiicate glass;

a bonding wire electrically connected with said exposed predetermined portion of the interconnection; and a third insulating film of organic resin material formed on said second insulating film and over said active element, said third insulating film reducing the number of alpha particles which penetrate into said active element;

said organic resin material being a member selected from the group consisting of polyimide isoindoloquinazolinedione and polyimide and containing less than 40 ppb of uranium and thorium;

said second insulating film being constructed and arranged between said third insulating film and first insulating film to prevent the penetration of alkali impurities into said active element in said body which come from the third insulating film of organic resin material, wherein said second insulating film consists essentially of phosphosilicate glass.

4. A monolithic integrated circuit device according to claim 2, wherein said insulating film has a thickness of 0.2 um to 3 um.

5. A monolithic integrated circuit device according to claim 3, wherein said second insulating film has a thickness of 0.3 um to 1.5 um.

6. A monolithic integrated circuit device according to claim 1, wherein said third insulating film is selectively formed on said second insulating film.

7. A monolithic integrated circuit device according to claim 6, wherein said second insulating film consists essentially of silicon nitride.

8. A monolithic integrated circuit device having reduced errors caused by the penetration of alpha particles into an active element thereof, said device comprising:

a semiconductor body;

at least one active element provided in an upper surface region of said body;

a first insulating film of inorganic insulating material formed on said upper surface of said semiconductor body;

an interconnection having a predetermined portion formed on said first insulating film and electrically connected with a predetermined portion of said active element;

a second insulating film of inorganic insulating material formed over said interconnection so as to expose the predetermined portion of said interconnection through a window, said second insulating film consisting essentially of silicon nitride or phosphosilicate glass;

a bonding wire electrically connected with said exposed predetermined portion of the interconnection; and a third insulating film of organic resin material formed on said second insulating film and over said active element, said third insulating third reducing the number of alpha particles which penetrates into said active element;

said organic resin material being a member selected from the group consisting of polyimide isoindoloquinazolinedione and polyimide and containing less than 40 ppb of uranium and thorium;

said second insulating film being constructed and arranged between said third insulating film and first insulating film to prevent the penetration of alkali impurities into said active element in said body which come from the third insulating film of organic resin material, wherein said third insulating film is selectively formed on said second insulating film, wherein said second film consists essentially of phosphosilicate glass.

9. A monolithic integrated circuit device according to claim 7, wherein said second insulating film has a thickness of 0.2 um to 1.5 um.

10. A monolithic integrated circuit device according to claim 8, wherein said second insulating film has a thickness of 0.3 um to 1.5 um.

11. A monolithic integrated circuit device according to claim 10, wherein said phosphosilicate glass has a phosphorus content of 3 mol % to 12 mol %.

12. A monolithic integrated circuit device having reduced errors caused by the penetration of alpha particles into an active element thereof, said device comprising:

a semiconductor body;

at least one active element formed in an upper surface region of said body;

an interconnection having a predetermined portion and electrically coupled to a predetermined portion of said active element;

a first insulating film of a first inorganic material interposed between said active element and said interconnection;

a third insulating film of organic resin material;

a second insulating film interposed between said first insulating film and said third insulating film and formed over said interconnection; and a bonding wire directly connected with said predetermined portion of said interconnection;

said organic resin material being a member selected from the group consisting of polyimide and polyimide isoindoloquinazolinedione and serving to reduce number of alpha particles which penetrate into said active element;

said second insulating film comprising silicon nitride or phosphosilicate glass, said second insulating film being constructed and arranged between said third insulating film and said first insulating film to prevent and penetration of alkali impurities into said active element that come from the third insulating film of organic resin material.

13. A monolithic integrated circuit device according to claim 12, wherein said second insulating film comprises silicon nitride having a window through which said predetermined portion of the interconnection is exposed.

14. A monolithic integrated circuit device having reduced errors caused by the penetration of alpha particles into an active element thereof, said device comprising:

a semiconductor body;

at least one active element formed in an upper surface region of said body;

an interconnection having a predetermined portion and electrically coupled to a predetermined portion of said active element;

a first insulating film of a first inorganic material interposed between said active element and said interconnection;

a third insulating film of organic resin material;

a second insulating film interposed between said first insulating film and said third insulating film and formed over said interconnection; and a bonding wire directly connected with said predetermined portion of said interconnection;

said organic resin material being a member selected from the group consisting of polyimide and polyimide isoindoloquinazolinedione and serving to reduce number of alpha particles which penetrate into said active element;

said second insulating film comprising phosphosilicate glass, said second insulating film being constructed and arranged between said third insulating film and said first insulating film to prevent the penetration of alkali impurities into said active element that come from the third insulating film of organic resin material, wherein said second insulating film has a window through which said predetermined portion of the interconnection is exposed.

15. A monolithic integrated circuit device according to claim 13, wherein said second insulating film has a thickness of 0.2 um to 3 um.

16. A monolithic integrated circuit device according to claim 14, wherein said second insulating film has a thickness of 0.3 um to 1.5 um.

17. A monolithic integrated circuit device according to claim 16, wherein said phosphosilicate glass has a phosphorus content of 3 mol % to 12 mol %.

18. A monolithic integrated circuit device according to claim 12, wherein said third insulating film is selectively formed on said second insulating film having a window through which said predetermined portion of the interconnection is exposed.

19. A monolithic integrated circuit device according to claim 18, wherein said second insulating film comprises silicon nitride.

20. A monolithic integrated circuit device having reduced errors caused by the penetration of alpha particles into an active element thereof, said device comprising:
   a semiconductor device;
   at least one active element formed in an upper surface region of said body;
   an interconnection having a predetermined portion and electrically coupled to a predetermined portion of said active element;
   a first insulating film of a first inorganic material interposed between said active element and said interconnection;
   a third insulating film of organic resin material;
   a second insulating film interposed between said first insulating film and said third insulating film and formed over said interconnection; and
   a bonding wire directly connected with said predetermined portion of said interconnection;
   said organic resin material being a member selected from the group consisting of polyimide and polyimide isoindoloquinazolinedione and serving to reduce number of alpha particles which penetrate into said active element;
   said second insulating film being constructed and arranged between said third insulating film and said first insulating film to prevent the penetration of alkali impurities into said active element that come from the third insulating film of organic resin material, wherein said third insulating film is selectively formed on said second insulating film having a window through which said predetermined portion of the interconnection is exposed, and wherein said second insulating film comprises phosphosilicate glass.

21. A monolithic integrated circuit device according to claim 19, wherein said second insulating film has a thickness of 0.2 um to 3 um.

22. A monolithic integrated circuit device according to claim 20, wherein said second insulating film has a thickness of 03. um to 1.5 um.

23. A monolithic integrated circuit device according to claim 22, wherein said phosphosilicate glass has a phosphorus content of 3 mol % to 12 mol %.

24. A monolithic integrated circuit device according to claim 12, wherein said first insulating film material comprises silicon dioxide.

25. A monolithic integrated circuit device having reduced errors caused by the penetration of alpha particles into an active element thereof, said device comprising:
   a semiconductor body;
   an active element formed in an upper surface region of said semiconductor body;
   an interconnection having a predetermined portion and electricity coupled to a predetermined portion of said active element;
   a first insulating film of a first inorganic material interposed between said active element and said interconnection;
   a third insulating film comprising a member selected from the group consisting of polyimide isoindoloquinazolinedione and polyimide for covering said active element and reducing the number of alpha particles which penetrate into said active element;
   a second insulating film comprising silicon nitride or phosphosilicate glass interposed between said first insulating film and said third insulating film and formed over said interconnection and over said active element;
   a window formed in said second and third insulating films through which said predetermined portion of said interconnection is exposed; and,
   a bonding wire directly connected with said predetermined portion of said interconnection through said window;
   said second insulating film being constructed and arranged between said third insulating film and said first insulating film to prevent the penetration of alkali impurities from said third insulating film into said active element.

26. A monolithic integrated circuit device having reduced errors caused by the penetration of alpha particles into an active element thereof, said device comprising:
   a semiconductor body;
   an active element formed in an upper surface region of said semiconductor body;
   an interconnection having a predetermined portion and electricity coupled to a predetermined portion of said active element;
   a first insulating film of a first inorganic material interposed between said active element and said interconnection;
   a third insulating film comprising a member selected from the group consisting of polyimide isoindoloquinazolinedione and polyimide for covering said active element and reducing the number of alpha particles which penetrate into said active element;
   a second insulating film comprising silicon nitride or phosphosilicate glass interposed between said first insulating film and said third insulating film and formed over said interconnected and over said active element;
   a window formed in said second and third insulating films through which said predetermined portion of said interconnection is exposed; and,
   a bonding wire directly connected with said predetermined portion of said interconnection through said window;
   said second insulating film being constructed and arranged between said third insulating film and said first insulating film to prevent the penetration of alkali impurities from said third insulating film into said active element, wherein said bonding wire is apart from a side wall portion of said window.

27. A monolithic integrate circuit device having reduced errors caused by the penetration of alpha particles into an active element thereof, said device comprising:
   a semiconductor body;
   an active element formed in an upper surface region of said semiconductor body;
   an interconnection having a predetermined portion and electricity coupled to a predetermined portion of said active element;

a first insulating film of a first inorganic material interposed between said active element and said interconnection;

a third insulating film comprising a member selected from the group consisting of polyimide isoindoloquinazolinedione and polyimide for covering said active element and reducing the number of alpha particles which penetrate into said active element;

a second insulating film comprising silicon nitride or phosphosilicate glass interposed between said first insulating film and said third insulating film and formed over said interconnection and over said active element;

a window formed in said second and third insulating films through which said predetermined portion of said interconnection is exposed; and, a bonding wire directly connected with said predetermined portion of said interconnection through said window;

said second insulating film being constructed and arranged between said third insulating film and said first insulating film to prevent the penetration of alkali impurities from said third insulating film into said active element, wherein said predetermined portion of said interconnection is formed on said first insulating film.

28. A monolithic integrated circuit device having reduced errors caused by the penetration of alpha particles into an active element thereof, said device comprising:

a semiconductor body;

at least one active element formed in an upper surface region of said body;

an interconnection having a predetermined portion and electrically coupled to a predetermined portion of said active element;

a first insulating film of a first inorganic material interposed between said active element and said interconnection;

a third insulating film of a first inorganic material interposed between said active element and said interconnection;

a third insulating film of an organic resin material selected from a group consisting of a polyimide and polyimide isoindoloquinazolinedione and formed over said active element for covering said active element and reducing the number of alpha particles which penetrate into said active element;

a second insulating film being constructed and arranged to prevent penetration of alkali impurities that come from said third insulating film of the organic resin material into said active element, said second insulating film being interposed between said first insulating film and third insulating film, and being formed over said active element; and a bonding wire directly connected with said predetermined portion of said interconnection.

29. A monolithic integrated circuit device according to claim 28, wherein said second insulating film comprises silicon nitride having a window through which said predetermined portion of the interconnection is exposed.

30. A monolithic integrated circuit device according to claim 29, wherein said second insulating film has a thickness of 0.2 um to 3 um.

31. A monolithic integrate circuit device having reduced errors caused by the penetration of alpha particles into an active element thereof, said device comprising:

a semiconductor body;

at least one active element formed in an upper surface region of said body;

an interconnection having a predetermined portion and electrically coupled to a predetermined portion of said active element;

a first insulating film of a first inorganic material interposed between said active element and said interconnection;

a third insulating film of a first inorganic material interposed between said active element and said interconnection;

a third insulating film of an organic resin material selected from a group consisting of a polyimide and polyimide isoindoloquinazolinedione and formed over said active element for covering said active element and reducing the number of alpha particles which penetrate into said active element;

a second insulating film being constructed and arranged to prevent penetration of alkali impurities that come from said third insulating film of the organic resin material into said active element, said second insulating film being interposed between said first insulating film and third insulating film, and being formed over said active element; and a bonding wire directly connected with said predetermined portion of said interconnection, wherein said second insulating film comprises phosphosilicate glass having a window through which said predetermined portion of the interconnection is exposed.

32. A monolithic integrated circuit device according to claim 31, wherein said insulating film has a thickness of 0.3 um to 1.5 um.

33. A monolithic integrated circuit device according to claim 32, wherein said phosphosilicate glass has a phosphorus content of 3 mol % to 12 mol %.

34. A monolithic integrated circuit device according to claim 28, wherein said third insulating film is selectively formed on said second insulating film having a window through which said predetermined portion of the interconnection is exposed.

35. A monolithic integrated device according to claim 28, wherein said second insulating film comprises silicon nitride.

36. A monolithic integrated circuit device according to claim 35, wherein said second insulating film has a thickness of 0.2 um to 3 um.

37. A monolithic integrated circuit device having reduced errors caused by the penetration of alpha particles into an active element thereof, said device comprising:

a semiconductor body;

at least one active element formed in an upper surface region of said body;

an interconnection having a predetermined portion and electrically coupled to a predetermined portion of said active element;

a first insulating film of a first inorganic material interposed between said active element and said interconnection;

a third insulating film of a first inorganic material interposed between said active element and said interconnection;

a third insulating film of an organic resin material selected from a group consisting of a polyimide and polyimide isoindoloquinazolinedione and formed over said active element for covering said active element and reducing the number of alpha particles which penetrate into said active element;

a second insulating film being constructed and arranged to prevent penetration of alkali impurities that come from said third insulating film of the organic resin material into said active element, said second insulating film being interposed between said first insulating film and third insulating film, and being formed over said active element; and a bonding wire directly connected with said predetermined portion of said interconnection, wherein said second insulating film comprises phosphosilicate glass.

38. A monolithic integrated circuit device according to claim 37, wherein said second insulating film has a thickness of 0.3 um to 1.5 um.

39. A monolithic integrated circuit according to claim 38, wherein said phosphosilicate glass has a phosphorus content of 3 mol % to 12 mol %.

40. A monolithic integrated circuit device according to claim 28, wherein said first insulating material comprises silicon dioxide.

41. A monolithic integrated circuit device having reduced errors caused by the penetration of alpha particles into an active element thereof, said device comprising:

a semiconductor body having an active element formed in an upper surface region;

a first inorganic insulating layer covering at least a portion of said upper surface;

a second inorganic insulating layer consisting of at least one of a phosphosilicate glass and silicon nitride formed on at least a portion of said first inorganic insulating layer and over at least a portion of said upper surface which includes said active element; and at least one insulating layer of organic material formed on said second inorganic layer and over said at least a portion of said upper surface which includes said active element, said organic material being selected from a group consisting of polyimide and polyimide isoindoloquinazolinedione for covering said active element and reducing the number of alpha particles which penetrate into said active element, said second inorganic insulating layer being constructed and arranged between said at least one insulating layer of organic material and said active element to prevent the penetration of alkali impurities from said insulating layer of organic material into said active element formed in said body.

42. A monolithic integrated circuit device according to claim 41, wherein said first inorganic insulating layer is formed of silicon dioxide.

43. A monolithic integrated circuit device according to claim 41, wherein said insulating layer has a thickness of more than 10 um.

44. A monolithic integrated circuit device as in claim 41, wherein said insulating organic layer has a thickness of more than 10 um.

45. A monolithic integrated circuit device as in claim 41, wherein said monolithic integrated circuit device is encapsulated in a ceramic package.

46. A monolithic integrated circuit device as in claim 41, wherein said monolithic integrated circuit device is encapsulated in a plastic package.

47. A monolithic integrated circuit device according to claim 44, wherein said active element is a memory element.

48. A monolithic integrated circuit device according to claim 41, wherein said insulating organic layer covers a major portion of the upper surface of said semiconductor body.

49. A monolithic integrated circuit device having reduced errors caused by the penetration of alpha particles into an active element thereof, said device comprising:

a semiconductor body having an active element formed in an upper surface region;

a first inorganic insulating layer covering at least a portion of said upper surface;

a second inorganic insulating layer formed on at least a portion of said for inorganic insulating layer and over at least a portion of said upper surface which includes said active element; and at least one insulating layer of organic material formed on said second inorganic layer and over said at least a portion of said upper surface which includes said active element, said organic material being selected from a group consisting of polyimide and polyimide isoindoloquinazolinedione for covering said active element and reducing the number of alpha particles which penetrate into said active element, said second inorganic insulating layer being constructed and arranged between said at least one insulating layer of organic material and said active element to prevent the penetration of alkali impurities from said insulating layer of organic material into said active element formed in said body;

wherein said second inorganic layer is phosphosilicate glass.

50. A monolithic integrated circuit device according to claim 41, wherein said second inorganic layer comprises silicon nitride.

51. A monolithic integrated circuit device according to claim 49, wherein said second insulating film has a thickness of 0.3 um to 1.5 um.

52. A monolithic integrated circuit device according to claim 51, wherein the phosphorus content of said phosphosilicate glass is in the range or 3 mol % to 12 mol %.

53. A monolithic integrated circuit device according to claim 50, wherein the thickness of said second insulating film is from 02 um to 3 um.

54. A monolithic integrated circuit device according to claim 1, wherein there is no wiring and no bonding paid on said insulating organic layer.

55. A monolithic integrated circuit device according to claim 12, wherein there is no wiring and no bonding pad on said insulating organic layer.

56. A monolithic integrated circuit device according to claim 25, wherein there is no wiring and no bonding pad on said insulating organic layer.

57. A monolithic integrated circuit device according to claim 25, wherein there is no wiring and no bonding pad on said insulating organic layer.

58. A monolithic integrated circuit device according to claim 44, wherein there is no wiring and no bonding pad on said insulating organic layer.

59. A monolithic integrated circuit semiconductor device comprising:

a semiconductor substrate;

a first insulating film of an inorganic insulating material having a window formed on a main surface of said semiconductor substrate, an interconnection formed on said first insulating film and electrically connected to said main surface of said semiconductor substrate through said window, a second insulating film of a material selected from a group consisting of phosphosilicate glass and silicon nitride formed on desired portions of said first insulating film and said interconnection so as to expose a part of a surface of said interconnection, a bonding wire electrically connected to the exposed part of said surface of said interconnection, a third insulating film of a material selected from the group consisting of polyimide-isoindro-quinazolinzion resin and polyimide resin formed on said second insulating film.

60. A semiconductor device according to claim 59, wherein said first insulating film comprises silicon dioxide.

61. A semiconductor device according to claim 59, wherein at least one active element is disposed in said semiconductor substrate and said interconnection is electrically connected to said active element.

62. A semiconductor device according to claim 59, wherein said active element is a memory element.

63. A semiconductor device according to claim 59, wherein no interconnection is disposed on said third insulating film.

* * * * *